United States Patent [19]

Mori

[11] Patent Number: 5,428,572
[45] Date of Patent: Jun. 27, 1995

[54] PROGRAM ELEMENT FOR USE IN REDUNDANCY TECHNIQUE FOR SEMICONDUCTOR MEMORY DEVICE

[75] Inventor: Seiichi Mori, Tokyo, Japan

[73] Assignee: Kabushiki Kaisha Toshiba, Japan

[21] Appl. No.: 90,440

[22] Filed: Jul. 14, 1993

Related U.S. Application Data

[62] Division of Ser. No. 688,298, Apr. 22, 1991, abandoned.

[30] Foreign Application Priority Data

Apr. 23, 1990 [JP]  Japan .................................. 2-107153

[51] Int. Cl.$^6$ ................................................ G11C 7/00
[52] U.S. Cl. ................................... 365/200; 365/182; 365/185; 365/230.06
[58] Field of Search ............ 365/200, 230.06, 184, 365/182; 371/10.1, 10.2, 10.3

[56] References Cited

U.S. PATENT DOCUMENTS

| | | | |
|---|---|---|---|
| 3,733,591 | 5/1973 | Cricchi | 340/173 R |
| 4,393,474 | 7/1983 | McElroy | 365/200 |
| 4,426,764 | 1/1984 | Kosa et al. | 29/571 |
| 4,490,900 | 1/1985 | Chiu | 29/571 |
| 4,538,245 | 8/1985 | Smarandoiu et al. | 365/200 |
| 4,556,975 | 12/1985 | Smith et al. | 371/10 |
| 4,635,232 | 1/1987 | Iwahashi et al. | 365/200 |
| 4,805,147 | 2/1989 | Yamanaka et al. | 365/154 |
| 4,975,881 | 12/1990 | Kagami | 365/200 |
| 5,063,425 | 11/1991 | Yamauchi et al. | 357/23.6 |
| 5,117,269 | 5/1992 | Bellizza et al. | 357/23.5 |
| 5,120,672 | 6/1992 | Mitchell et al. | 437/43 |
| 5,142,438 | 8/1992 | Reinberg et al. | 361/313 |
| 5,147,813 | 9/1992 | Woo | 437/43 |

FOREIGN PATENT DOCUMENTS

| | | |
|---|---|---|
| 0058049A3 | 8/1982 | European Pat. Off. |
| 0305741A2 | 3/1989 | European Pat. Off. |
| 3043651A1 | 8/1981 | Germany |
| WO82/04162 | 11/1982 | WIPO |

OTHER PUBLICATIONS

European Search Report dated Mar. 1, 1993 for Application No. 91106508.4 to Kabushiki Kaisha Toshiba.
IBM Technical Disclosure Bulletin by IBM Corp, entitled "Redundancy Programming With Threshold Shift" dated Dec. 1981.
IEEE 1982 National Aerospace and Electronics Conference entitled "System Programmable Redundancy In a 64K EEPROM" by Westinghouse Electric Corporation, vol. 3, 18–20 May 1982.
Patent Abstract of Japan, Publication No. JP55022882 entitled "Semiconductor Device", Apr. 18, 1980.
Patent Abstract of Japan, Publication No. JP61088548 entitled "Semiconductor Device", Sep. 9, 1986.
Patent Abstract of Japan, Publication No. JP1218061 entitled "Manufacture of Semiconductor Integrated Circuit", Nov. 29, 1989.
23rd annual proceedings of 1985 IEEE IRPS, "A 100 Å Thick Stacked SiO$_2$/Si$_3$N$_4$/SiO$_2$ Dielectric Layer for Memory Capacitor", pp. 18, Mar. 26, 1985, T. Watanabe et al.

*Primary Examiner*—Joseph A. Popek
*Attorney, Agent, or Firm*—Banner & Allegretti, Ltd.

[57] ABSTRACT

Improvement of a fuse for use in the redundancy technique particularly for a semiconductor memory device. The fuse is constituted by an MIS type transistor having a gate insulating layer, which comprises at least two types of insulating films. Redundancy information is stored by shifting the threshold value of the MIS type transistor.

11 Claims, 7 Drawing Sheets

PROGRAM ELEMENT FOR USE IN REDUNDANCY TECHNIQUE FOR SEMICONDUCTOR MEMORY DEVICE

This application is a division, of application Ser. No. 07/688,298, filed Apr. 22, 1991, now abandoned.

BACKGROUND OF THE INVENTION

1. Field of the Invention

The present invention relates to a semiconductor memory device and a method of fabricating the same. More particularly, this invention pertains to the improvement of a fuse of a redundancy circuit (defect sparing circuit) included in a semiconductor memory device, and a method of fabricating a semiconductor memory device having the improved fuse.

2. Description of the Related Art

Recently, semiconductor memory devices have been designed to have an ever increasing memory capacity. The large-scale increase in the memory capacity increases the number of memory cells one chip holds. It is therefore very difficult to have no defective cells in a single chip. Today, therefore, the redundancy technique to replace defective memory cells by redundant memory cells is essential in fabrication of semiconductor memory devices.

A redundancy circuit should have a program element which stores redundancy information to replace defective memory cells with spare memory cells. A polysilicon fuse is normally used as the program element, and redundancy information is stored by cutting the fuse by means of a laser.

Of semiconductor memory devices, some EPROMs, a non-volatile type, may use an EPROM memory cell as a program element with its top covered with an aluminum film to prevent the stored information from dischanging at the time of irradiating ultraviolet rays for data erasure.

These techniques however have the following shortcomings.

The former technique can cut the fuse only before packaging and cannot spare defective memory cells after packaging.

The latter technique should cover the top of each program element with aluminum or the like to inhibit irradiation of ultraviolet rays or the like on the program element. The aluminum film for shielding the ultraviolet rays or the like needs a very large area in one chip. In addition, the ultraviolet rays are likely to reach this type of program element through reflection from various portions even if the top of the program element is coated with the aluminum film, so that the reliability of the program element holding data is not sufficient. Further, the data holding characteristic of the program element is quite the same as that of an ordinary EPROM memory cell. When an acceleration test (leaving a device for a long period of time under a high-temperature environment) is conducted to check the data-retention characteristic of an EPROM cell, therefore, electrons accumulated in a floating gate may leave, resulting in malfunction of the device.

As described above, the conventional program elements cannot spare defective memory cells after a chip is sealed in a package. Also the conventional program elements have a lower reliability of holding data though they occupy considerable space in a single chip.

SUMMARY OF THE INVENTION

It is therefore an object of the present invention to provide a semiconductor memory device having a program element, which can ensure sparing defective memory cells even after packaging is done, and needs a small area with high reliability concerning data storage, and also to provide a method of efficiently fabricating a semiconductor memory device having such a program element.

To achieve the object, according to one aspect of the present invention, there is provided a semiconductor memory device comprising:
  memory cells for storing data;
  conductive lines, connected to the memory cells, for supplying electric signals to the memory cells;
  at least one program element, connected to the conductive lines, for storing redundancy information;
  an MIS type transistor with a gate insulating layer, constituting the program element; and
  at least two types of insulating films constituting the gate insulating layer.

According to another aspect of the present invention, there is provided a method of fabricating a semiconductor memory device comprising steps of:
  (a) forming an element isolating film on a semiconductor substrate to provide at least a memory cell forming portion and a program element forming portion on the substrate;
  (b) forming an insulating film on an exposed surface of the substrate;
  (c) forming a first conductive film on a structure resulting from the step (b);
  (d) removing the first conductive film and the insulating film on the program element forming portion;
  (e) forming a laminated insulating film including at least two types of insulating films, on a structure resulting from the step (d);
  (f) forming a second conductive film on a structure resulting from the step (e);
  (g) patterning the second conductive film, the laminated insulating film, the first conductive film and the insulating film to form a gate electrode portion of a transistor in the memory cell forming portion and the program element forming portion.

According to the above semiconductor memory device, the program element is constituted by an MIS type transistor whose gate insulating layer comprises an oxidation film and another insulating film. This structure can capture carriers using the trap formed between these two films to change the threshold value of the MIS type transistor. The change in threshold value can alter the state of the MIS type transistor between the "conductive" state and "non-conductive" state, thereby permitting data storage. Further, by virtue of the trap, the carriers are more effectively prevented from moving into the substrate than in the conventional program element. Hence, the program element according to the invention has good data-retention characteristic. In addition, the insulating layer can be designed to enable the trap to capture the carriers with high efficiency. This further improves the data-retention characteristic of the program element. Furthermore, as information can be electrically written into the program element, defective memory cells can be spared even after the chip is sealed in a package.

According to the above fabrication method, the gate insulating film of the program element and the floating gate or control gate of each memory cell can be formed in the same step, so that no additional step is required to form the program element in this embodiment.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A preferred embodiment of the present invention will now be described referring to the accompanying drawings.

Figure 1:
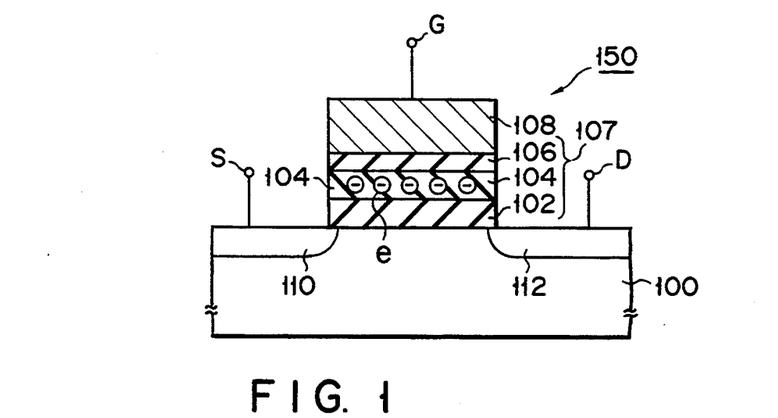
FIG. 1 is a cross section illustrating a program element included in a semiconductor device according to one embodiment of the present invention.

FIG. 1 illustrates a cross section of a program element which the semiconductor memory device according to the embodiment of the present invention includes.

As shown in FIG. 1, a first silicon oxide film 102 is formed on a p-type silicon substrate 100, a silicon nitride film 104 on the film 102, a second silicon oxide film 106 on the film 104, and a polysilicon gate electrode 108 on the film 106. An n-type source region 110 and an n-type drain region 112 are formed in the substrate 100, excluding the portion below the gate electrode 108.

A program element 150 with the above structure is an MIS type transistor with a gate insulating film 107, a stacked film (silicon oxide film 102/silicon nitride film 104/second silicon oxide film 106).

redundancy information is written by injecting electrons e into the silicon nitride film 104 which lies between the silicon oxide films 102 and 106 of the gate insulating layer 107 of the MIS type transistor. The electrons e are captured around the boundary between the silicon nitride film 104 and the silicon oxide film 102. The gate insulating layer 107 with the electrons e captured shifts a threshold value of the transistor in the positive direction. This shift of threshold value renders the MIS type transistor non-conductive to store the redundancy information. This corresponds to a "cut-off" in the program element constituted by a fuse.

For writing other redundancy information, the electrons e, which have been injected into the gate insulating layer 107 of all the MIS type transistors, can be extracted therefrom (or a positive hole is injected), and the threshold value may be shifted in the negative direction to be rendered conductive. This will correspond to "connection" which never occurs in the program element constituted by the fuse.

As described above, it is determined whether the MIS type transistor is ON or OFF when a voltage higher than the threshold value (without the electrons e) of the transistor is applied to the gate electrode 108. Redundancy information is constituted by the ON or OFF state of the program element.

If the above-structured program element 150 is used, the extraction of the electrons e from the gate insulating layer 107 and the injection of the electrons e into the layer 107 can be performed, thus erasing the redundancy information.

Writing/deleting specific redundancy information, or injection/extraction of electrons will be executed in any of the following different cases of potential conditions.

By injection of electrons
  (1) gate 108: positive potential source 110: grounded drain 112: grounded
  (2) gate 108: positive potential source 110: grounded drain 112: floating
  (3) gate 108: positive potential source 110: floating drain 112: grounded
  (4) gate 108: positive potential source 110: grounded drain 112: positive potential By extraction of electrons
  (1) gate 108: grounded source 110: positive potential drain 112: grounded
  (2) gate 108: grounded source 110: grounded drain 112: positive potential
  (3) gate 108: grounded source 110: positive potential drain 112: positive potential Since electrons can be injected into a double-layer film in the same way that electrons are injected into the stacked film (oxide film/nitride film/oxide film, the gate insulating layer 107 of the MIS type transistor with the stacked film (oxide film/nitride film/oxide film) can be replaced by an MIS type transistor with a double-layer film (oxide film/nitride film, or nitride film/oxide film). Even in this case, the electrons will be captured in the nitride film, particularly around the boundary between the nitride film and the oxide film. As well known, the nitride film can capture the electrons in its traps, many of which appear specifically at the boundary between the film and the oxide film, and also can extract the captured electrons (or inject positive holes).

There are films besides the nitride film, such as a tantalum oxide film and an aluminum oxide film, for capturing carriers. The nitride film shown in FIG. 1 can be replaced with these films.

Further, it is important according to the present invention to improve the charge-retention characteristic (storing the redundancy information) of the MIS type transistor. As the charge-retention characteristic is improved, the characteristic of storing the redundancy information can be enhanced accordingly.

For the improvement of the carrier-retaining character, (i.e. charge-retention characteristic) the preferable gate insulating film should have the surface of a film for capturing the carriers covered with other films, as depicted in the laminated film shown in FIG. 1. Also, the films which cover the film for capturing the carriers should be formed to effectively prevent the extraction of the carriers to the substrate, or the injection of the reverse conductive carriers from the gate electrode. Of the above-described laminated film, for example, if the silicon oxide films 102 and 106 have the following thickness, it is possible to effectively prevent neutralization of loads caused by extracting the carriers or injecting the reverse conductive carriers:

Silicon oxide film 102: 50 angstroms or thicker; and
Silicon oxide film 106: 25 angstroms or thicker.

Tunneling of the electrons e to the substrate 100 can be prevented with the silicon oxide film 102 equal to or more than 50-angstrom thick. Provided the silicon oxide film 106 is equal to or more than 25-angstrom thick, the injection of the positive hole from the gate electrode can be prevented.

Figure 2:
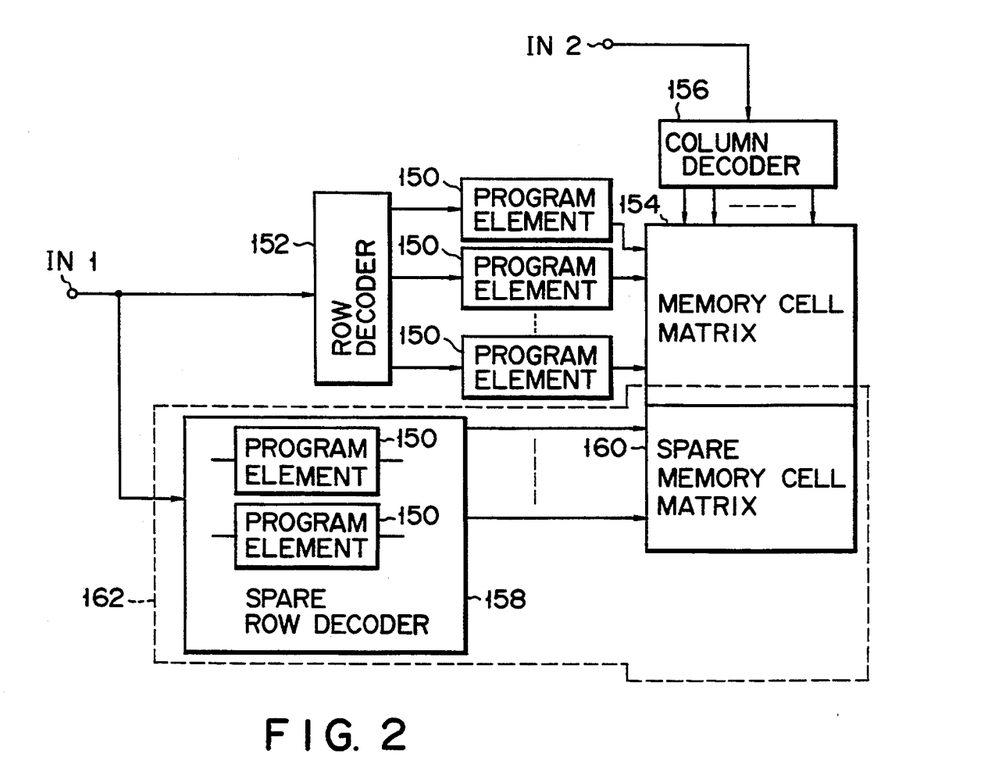
FIG. 2 is a schematic block diagram of a semiconductor memory device having a redundancy circuit.

FIG. 2 is a schematic block diagram of the semiconductor memory device comprising the redundancy circuit.

The program element 150 described above is included in a program element block in the block diagram shown in FIG. 2.

A row decoder 152 has its end connected to a row address input IN1 and its remaining ends respectively connected through the program elements 150 to word lines (not shown) in a memory cell matrix 154. A column decoder has its end connected to a column address input IN2 and its remaining ends connected to bit lines (not shown) in the memory cell matrix 154, respectively. A spare row decoder 158 has its end connected to the row address input IN1, and its remaining ends individually connected to spare word lines (not shown) in a spare memory cell matrix 160. The spare row decoder 158 has the program elements 150 with the same structure as described above.

A region 162 including the spare row decoder 158 and the spare memory cell matrix 160 is a redundancy circuit.

The method for sparing defective cells may be the same as the one performed by the redundancy circuit that breaks the fuse. For instance, such a method will be executed as follows.

Suppose that there are defective cells in the memory cell matrix 154. The redundancy information is written in the program elements 150 of the word lines where the respective defective cells are connected. As explained in FIG. 1, for example, the threshold value of the MIS type transistor which is a constituent of the program element 150 is shifted in the positive direction, thus electrically removing the word lines connected to the defective cells from a chip. The redundancy information is also written to a requested program element 150 in the spare row decoder. When the threshold value of the MIS type transistor constituting the program element 150 is shifted in the positive direction to cause the above word lines to be separated electrically, a program is set to select spare word lines in the spare memory cell matrix.

One fabrication method of the semiconductor memory device which comprises the program element according to the present invention will now be described.

FIGS. 3A to 3J illustrate the cross sections of the EPROM including the program element of this invention according to the fabricating procedures.

Figure 3A:
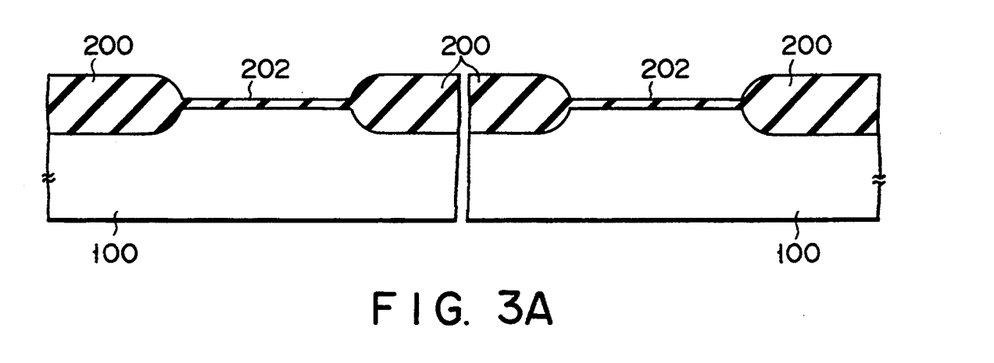
FIGS. 3A to 3J are cross sections illustrating an EPROM which has the program element according to the present invention in the order of fabricating procedures.

As shown in FIG. 3A, using a selective oxide method, a field insulating film 200 is formed, for example, 5000-angstrom thick on the main surface of the p-type silicon substrate 100. A first gate insulting film (silicon oxide film) 202 is provided on the surface of an element region which is isolated by the field insulating film 200. The first gate insulating film 202 is formed, for example, 200-angstrom thick on the surface of the element region.

Figure 3B:
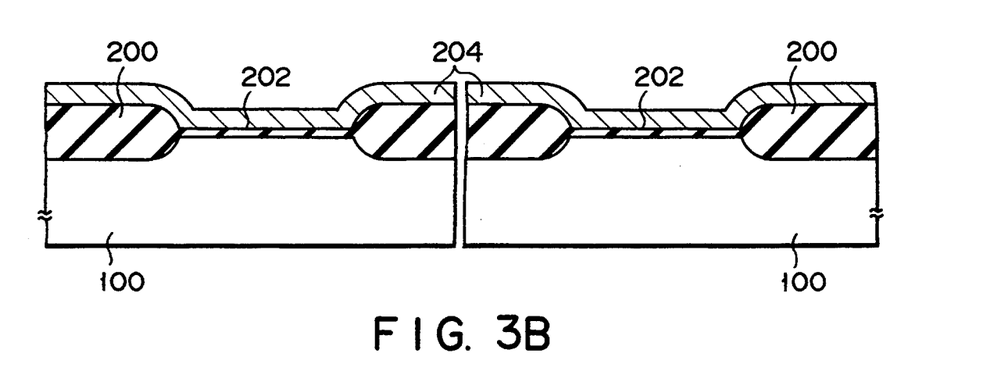

Then, as shown in FIG. 3B, a first polysilicon layer 204 is entirely formed as a floating gate of the EPROM cell, using a CVD method. The first polysilicon layer 204 is rendered conductive (n-type) by providing phosphorus.

Figure 3C:
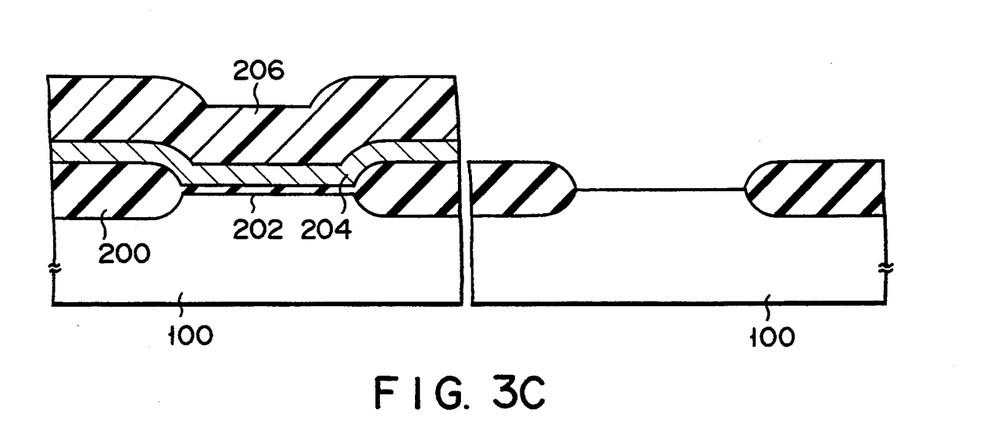

FIG. 3C shows that a photoresist 206 covers atop. Then the photoresist 206 is selectively erased with a photo-etching method to expose a program element forming portion. With the photoresist 206 as a mask, the first polysilicon layer 204 and the first gate insulating film 202 are etched, exposing the surface of the substrate 100.

Figure 3D:
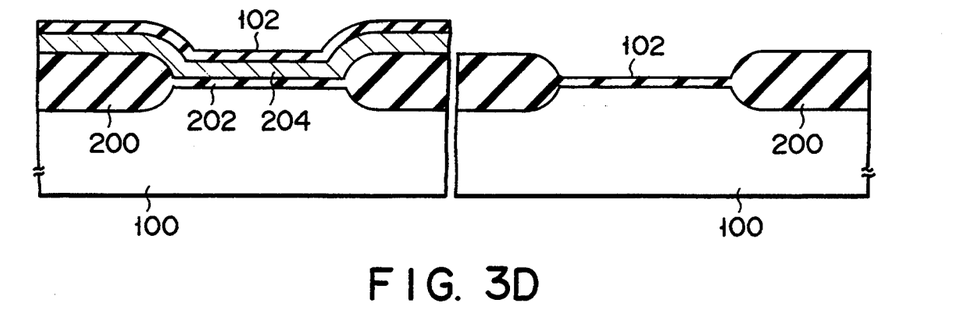

Then, as shown in FIG. 3D, after the photoresist 206 is eliminated, the thermal oxide film 102 is deposed on the exposed silicon surface using a thermal oxidation method. In this time, the oxide film 102 is oxidized to become about 50 angstrom thick on the surface of the program element forming portion of the substrate 100. Since the first polysilicon layer 204 contains a considerable amount of phosphorus, this causes an acceleration oxide effect, forming an oxide film approximately 100-angstrom thick.

Figure 3E:
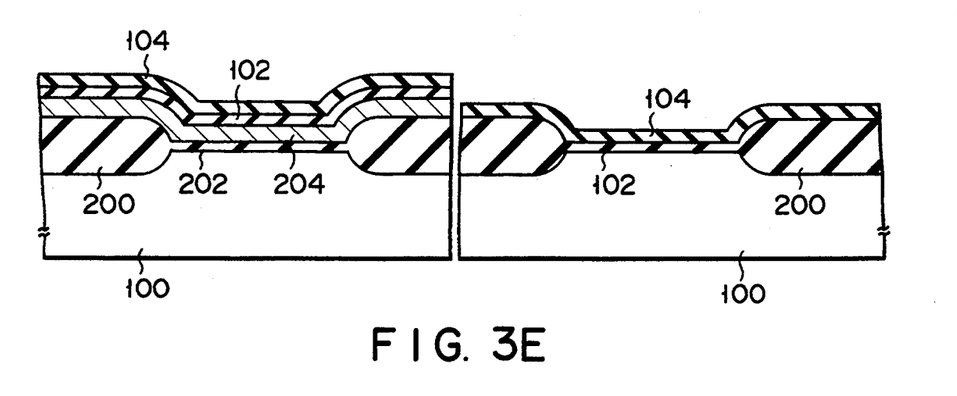

FIG. 3E illustrates that the silicon nitride film 104 is formed about 100 angstrom thick on a resultant structure, for example, with an LPCVD method.

Figure 3F:
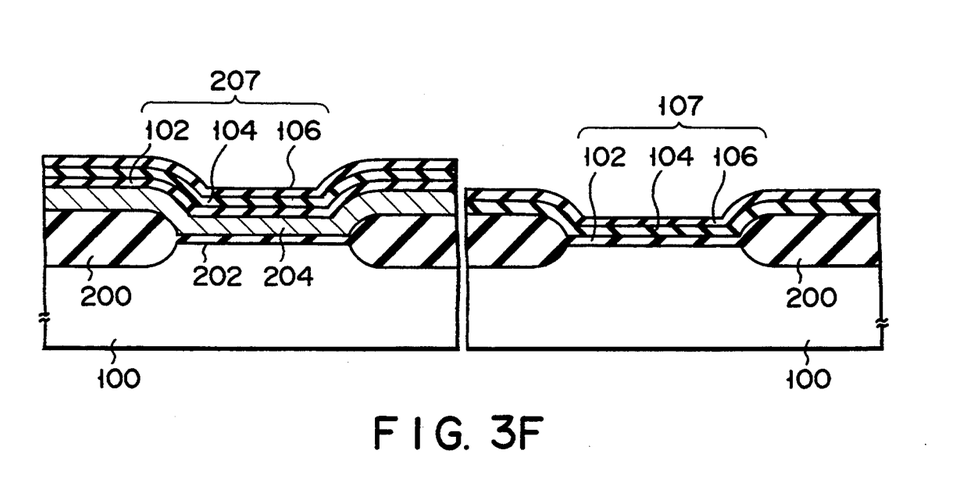

Further, the silicon oxide film 106 is provided approximately 30 angstrom thick on the silicon nitride film 104 with the thermal oxidation method, for example, as shown in FIG. 3E. Through this process, formed on the program element forming portion is the tri-layer gate insulating film 107, composed of oxide film (50 angstrom thick)/nitride film (80 angstrom)/oxide film (30 angstrom) in the named order from the substrate 100. A second gate insulating film 207 is also formed as a tri-layer film composed of oxide film (100 angstrom thick)/nitride film (80 angstrom)/oxide film (30 angstrom) in the named order from the first polysilicon layer.

Figure 3G:
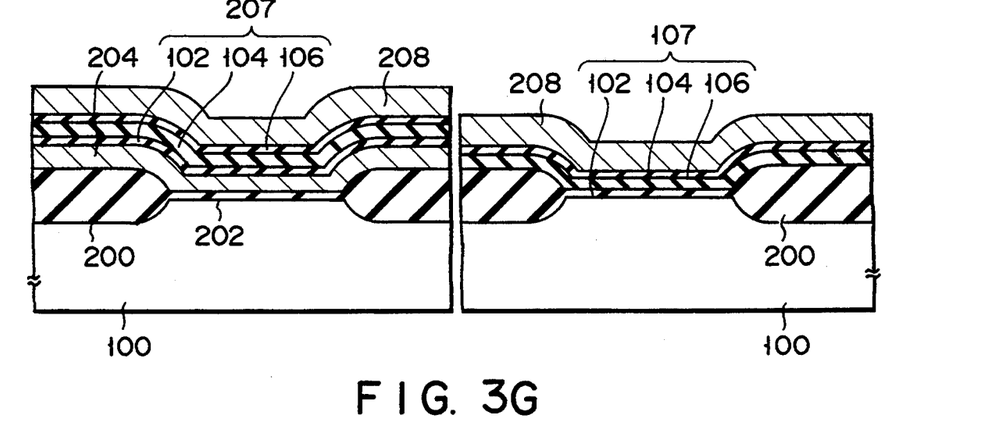

A second polysilicon sheet layer 208 is formed on the resultant structure with the CVD method, for example, as shown in FIG. 3G. Then the sheet layer 208 is rendered conductive (n-type) by introducing phosphorus, for example.

Figure 3H:
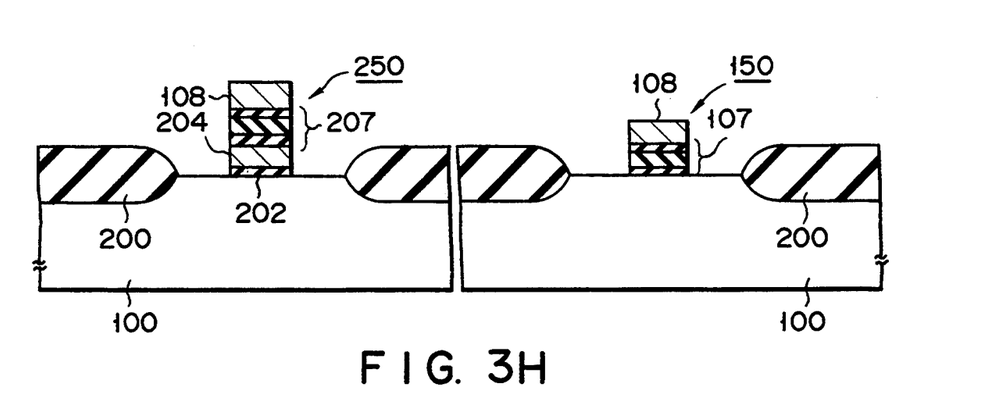

Next, as shown in FIG. 3H, the second polysilicon sheet layer 208, etc. is patterned using the photo-etching, thus defining second polysilicon layer 108 (used as a gate) and forming gate electrodes of an EPROM cell transistor 250 and the program element 150 on the memory cell forming portion and the program element forming portion, respectively.

Figure 3I:
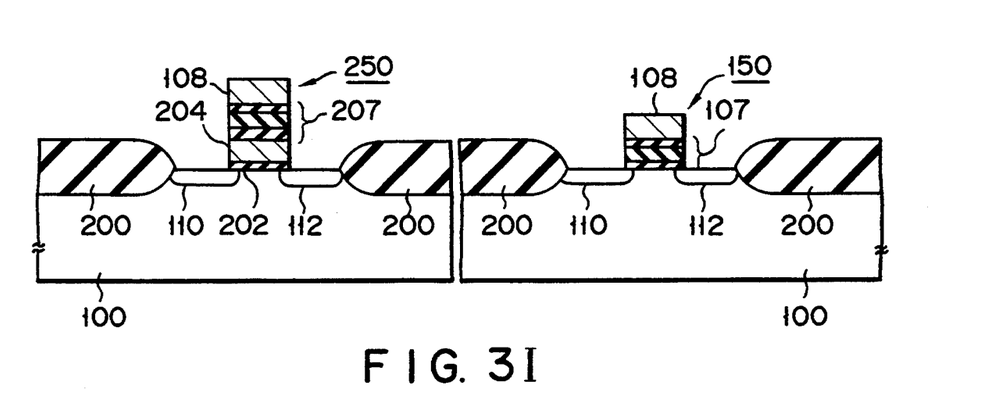

Then, arsenic ions, for example, are injected into the substrate 100 while the gate electrodes and the field insulating film 200 serve as masks, as shown in FIG. 3I.

Figure 3J:
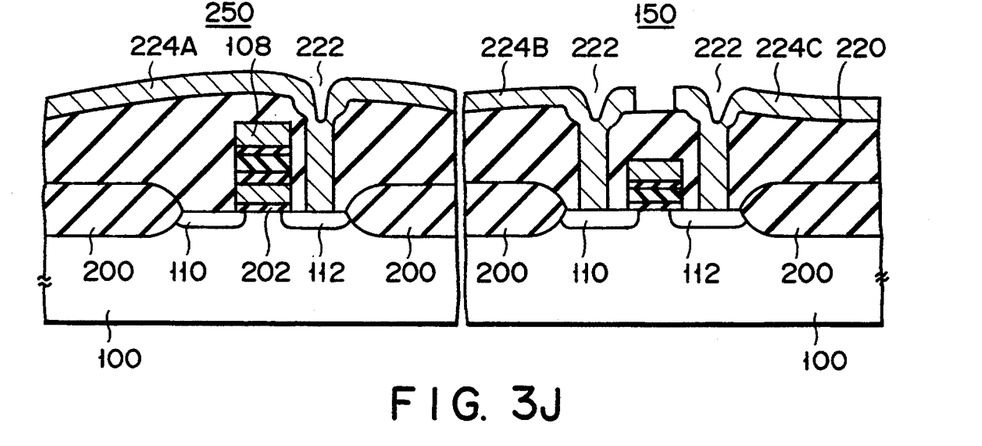

An interlayer insulating film 220 is deposited on the resultant structure as shown in FIG. 3J, after thermally oxidzing the surfaces of the gate electrodes. During this thermal oxidation, the arsenic ions are activated in the substrate 100, whereby a source 110 and a drain 112 are formed for the EPROM cell, and a source 110 and a drain are formed for the program element 150. A heat treatment is executed, which is performed also for the interlayer insulating film 220 for reflowing thereof. Further, a contact hole is formed in the interlayer insulating film 220 to communicate with a predetermined section of the device. A metal layer, such as an aluminum layer, is deposited on the film 220 using a sputtering method, for example. The metal layer is then patterned with the photo-etching method, forming wiring layers 224A, 224B, and 224C. The wiring layer 224A which is connected to the drain 112 of the cell transistor 250 is a bit line, for example. The wiring layer 224B, connected to the source 110 of the program element 150, is to be connected, for example, to the word line 108 in the memory cell, while the wiring layer 224C, connected to the source 110 of the program element 150, is to be connected to a row decoder (not shown), for example.

Through the above procedures, the EPROM which includes the program element according to the present invention is fabricated.

In the EPROM structured above, the program element 150 which comprises the MIS type transistor as shown in FIG. 1 is formed on the program element forming portion. A tri-layer (oxide film, nitride film and oxide film) film is used as the second gate insulating film in the memory cell forming portion to form the EPROM cell transistor 250 for increasing the capacity between a control gate and the floating gate.

Using the above-described fabricating method, the program element 150 and the cell 250 can be formed on the single substrate 100, and the number of steps will not be increased.

The MIS type transistor constituting the program element 150 has a threshold value voltage $V_{tb}$, about 1 V, in a normal state (without the electrons), and becomes conductive within the normal voltage range, about 3 to 5 V.

When a voltage of, for example, 14 V is applied to the gate 108 (when the source and the drain are grounded), however, an electric field E of approximately 11.6 MV/cm is applied to the gate insulating film 107, causing the flat band voltage $V_{FB}$ on the gate insulating film 107 to shift equal to or higher than 5 V in the positive direction. (Reference materials: 23rd annual proceedings of IEEE IRPS, p 22, FIG. 5)

The threshold value $V_{tb}$ is therefore 6 V approximately, so that the MIS type transistor is not conductive within the normal voltage range about 3 to 5 V.

The description will now be given of the results of the examinations using the EPROM (hereafter referred to as "EPROM-MIS") with the program element constituted by the MIS type transistor, and the EPROM (hereafter referred to as "EPROM-EP") with the program element constituted by the EPROM cell.

Figure 4:
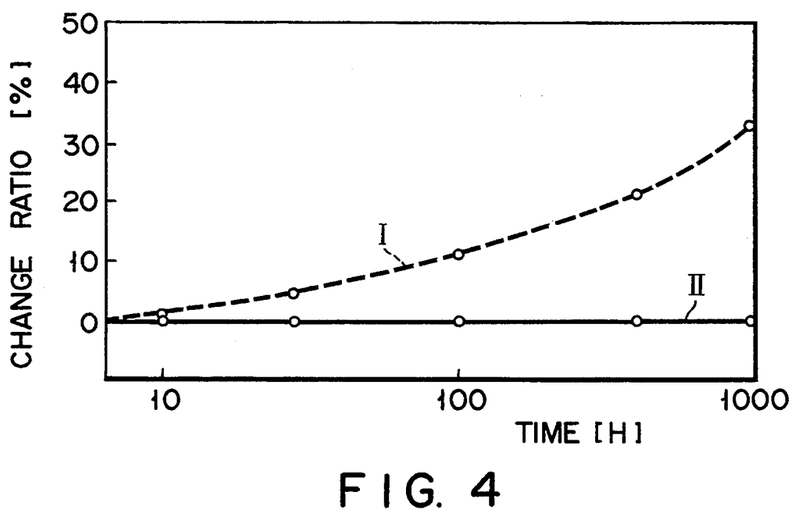
FIG. 4 is a graph indicating the result of measuring the ratio of a variation in threshold values of the program element of this invention and the conventional program element while irradiating ultraviolet rays on these program elements.

FIG. 4 is a graph indicating the results of the change ratio of the threshold voltage of the program element after the EPROM-MIS and EPROM-EP are radiated with ultraviolet rays.

The EPROM-EP had a change of 30% in the threshold voltage after 1000-hour radiation, as indicated by the line I shown in FIG. 4. The EPROM-MIS, however, had almost no change in the threshold voltage after the 1000-hour radiation, as indicated by the line II.

The EPROM-EP had the upper portion of its program element covered with the aluminum film, while the EPROM-MIS had no cover, such as aluminum, on the upper portion of its program element.

Figure 5:
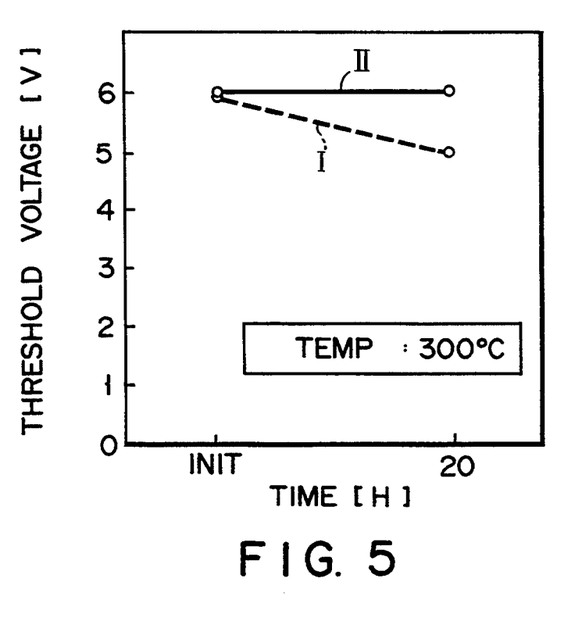
FIG. 5 is a graph showing the result of the acceleration test for the program element of this invention and the conventional program element left in a furnace at 300° C.

FIG. 5 a graph showing the results of the threshold value voltage of the program element after the acceleration test has been executed for the EPROM-MIS and the EPROM-EP both lying in a furnace at 300° C.

After left for 20 hours there, the EPROM-EP had its threshold voltage reduced by about 1 V, approximately from 6 V to 5 V as indicated the line I shown in FIG. 5. The threshold value of the EPROM-MIS, however, was barely reduced at all from the 6 V even after 20 hours had passed, as indicated by the line II.

As described above, the program element constituted by the MIS type transistor according to the present invention is superior in a load-retaining characteristic, and is thus capable of storing the redundancy information for a long time. Since the program element is structured with the MIS type transistor, the writing/storing of the redundancy information can be electrically performed. Thus, it is possible to spare defective memory cells even after the chip is sealed in a package, and also to delete the stored information.

Further, the upper portion of this program element is not necessarily covered with the aluminum film, for example, so that the program element occupies only small space of the total chip space.

The program element according to this invention is incorporated in not only the EPROM of a control gate/floating gate-stacking type but also in any type of a non-volatile semiconductor memory device (ROM). In the case of an $E^2$PROM of the control gate/floating gate-stacking type, there is an advantage that the gate insulating film of the MIS type transistor as described above and the second gate insulating film of the $E^2$PROM can be combined for use.

The $E^2$ROM, of the control gate/floating gate-stacking type and a totally data deleting type, also has such an advantage.

The program element according to the present invention can be incorporated in any type of a volatile semiconductor memory device (RAM). Particularly, in the case of a dynamic type RAM, there is an advantage that the above-described gate insulating film can be used as a capacitor film of a dynamic type RAM cell. For example, when the laminated film, oxide film/nitride film/oxide film, is applied to the capacitor film, obtaining the capacitor film of larger capacity for the dynamic type RAM cell at the same time.

The dynamic type RAM comprising the program element according to this invention will now be explained together with its fabricating method.

FIGS. 6A to 6E illustrate the cross sections of the dynamic type RAM which comprises the program element according to the present invention in the order of the fabricating procedures.

Figure 6A:
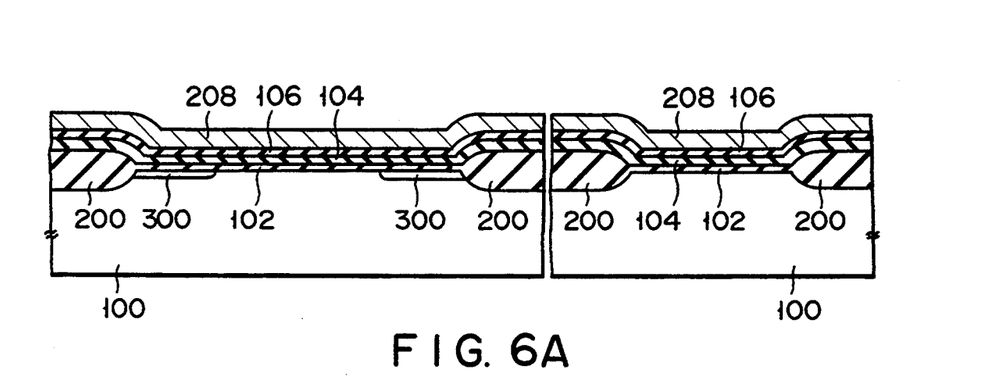
FIGS. 6A to 6E are cross sections illustrating a dynamic type RAM including the program element of this invention in the order of fabricating procedures.

First, as shown in FIG. 6A, the field insulating film 200 is formed, for example, on the surface of the P-type silicon substrate 100 using a LOCOS method. The photoresist is covered over, and a pattern for forming a storage node electrode is deposited on the photoresist using the photo-etching method.

As the photoresist is used as a mask, ions of n-type impurity for forming the storage node electrode is injected. The photo resist is then removed. The thermal oxide film 102 is deposited on the surface of the exposed silicon substrate 100 with the thermal oxidizing method, for example. Further, the silicon nitride film 104 is formed on the thermal oxide film 102, and the thermal oxide film is formed on the surface of the film 104 using the thermal oxidizing method, for example. The first polysilicon layer 208 is then formed on the resultant structure. The n-type impurity is injected into the first polysilicon layer 208 to be rendered conductive (n-type).

Figure 6B:
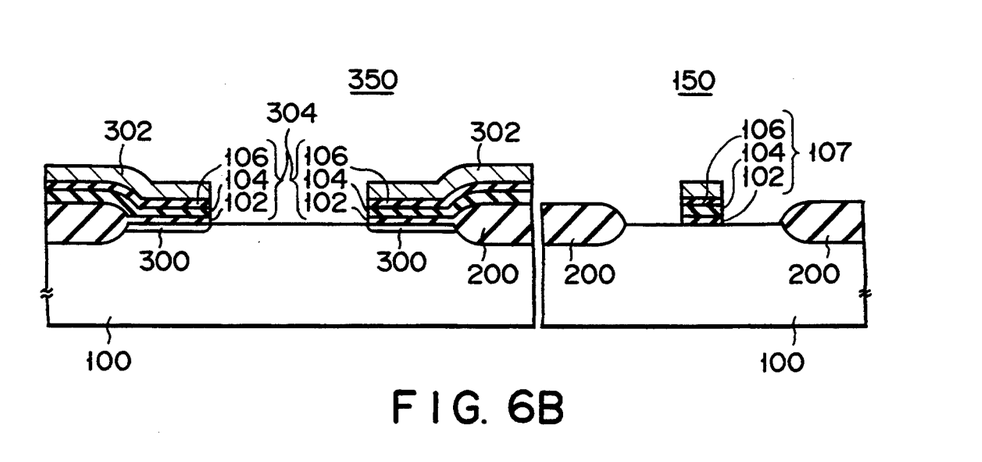

Then, the first polysilicon layer 208 is patterned using the photo-etching ethod, as shown in FIG. 6B. This patterning forms a gate electrode portion for the program element 150. In the memory forming region is formed the plate electrode 302 of the memory cell 350. Further etching is conducted to etch the oxide film 102, nitride film 104 and oxide film 106 in order, thus forming the tri-layered gate insulating film 107 comprising these films 102, 104, and 106 of the memory cell 350. Also the tri-layered capacitor film 304 comprising the films 102, 104 and 106 of the memory cell 350 is formed.

Figure 6C:
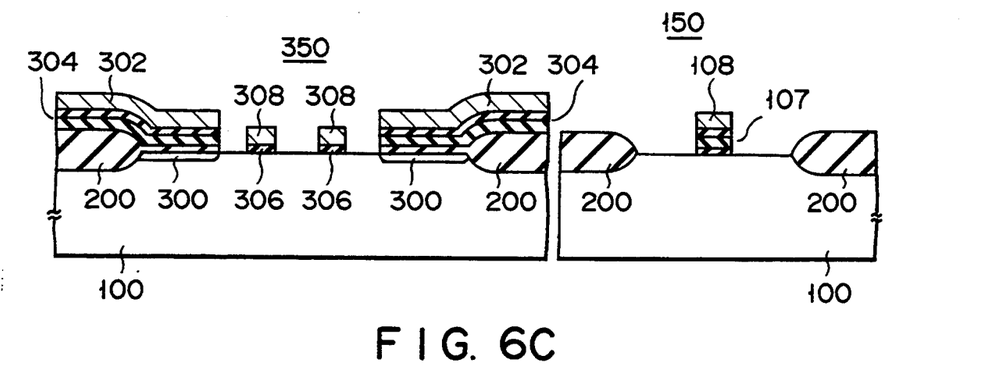
Figure 6D:
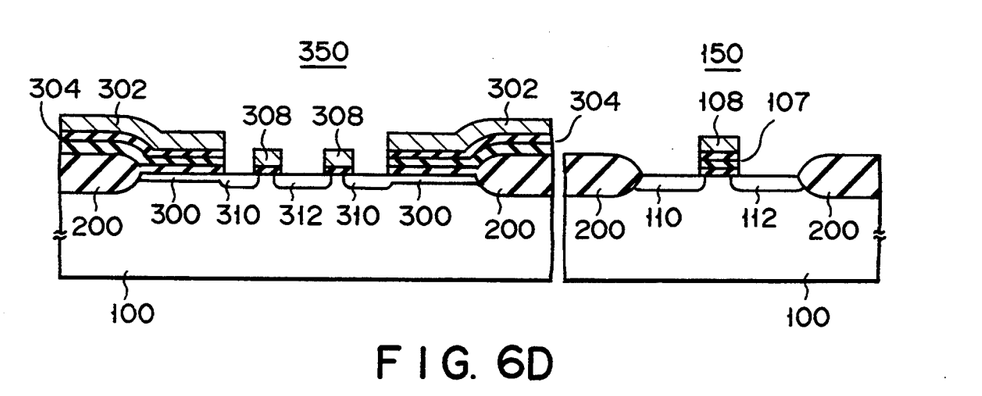

The exposed silicon surface is then thermally oxidized to form a thermal oxide film serving as the gate insulating film of a cell transistor of the memory cell 350, as shown in FIG. 6C. Then, the second polysilicon layer is formed on the resultant structure. Then, for example, and n-type impurity is injected in the second polysilicon layer to make the second polysilicon layer conductive. This second polysilicon layer is then patterned using the photo-resist etching, forming the gate electrode 308 of the cell transistor of the memory cell 350. Further etching is conducted to etch the thermal oxide film formed on the surface of the silicon substrate 100, thus forming the gate insulating film 306 comprising the thermal oxide film, below the gate electrode 308.

with the gate electrodes 108, 308, the field insulating film 200 and the plate electrode 300 as masks, for example, a n-type impurity is injected in the silicon substrate 100, as shown in FIG. 6D. As a result, the source region 110 and drain region 112 of the program element 150 are formed. Also the source region 310 and drain region 312 of the cell transistor are formed. At this time, the source region 310 fot the cell transistor is electrically connected to the storage node electrode 300.

Figure 6E:
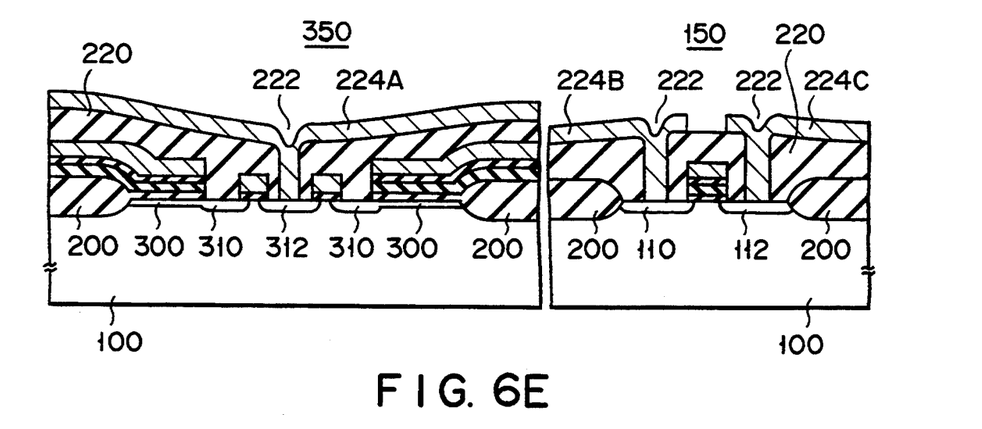

Then, the interlayer insulating film 220 is deposited on the resultant structure, as shown in FIG. 6E after thermally, oxidizing the surface of the gate electrode and storage node electrode. At this time, the n-type impurity injected in the drain regions 112 and 312 of the source regions 110 and 310 in the substrate 100 is activated. The resultant structure is then subjected to a thermal treatment which also serves as reflowing of the interlayer insulating film. Then, the contact holes 222 communicating with predetermined sections of the device are formed in the interlayer insulating film 220. On the interlayer insulating film 220 is formed a metal layer, such as an aluminum layer, by the sputtering method, for example. Then, the metal layer is patterned using the photo-etching method, forming the wiring layers 224A, 224B and 224C, etc.

Through the above steps, a DRAM having the program element of the present invention is completed.

As described above, the program element according to the present invention can be incorporated in a DRAM.

According to the fabrication method of this invention, the gate insulating film 107 of the program element 150 and the capacitor film 304 of the memory cell 350 can be formed by the oxide film 102, nitride film 104 and oxide film 106 which are formed in the same step. This method can incorporate the program element of this invention in a DRAM without increasing the necessary fabrication steps.

The present invention is not limited to the above particular embodiment, but may be modified in various manners within the scope and spirit of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electrically erasable nonvolatile memory device comprising:
   a semiconductor substrate;
   memory cell means having a source region and a drain region which are located in a surface region of the semiconductor substrate, a first gate insulation film formed on that portion of the semiconductor substrate which is located between the source region and the drain region, a charge-accumulating floating gate electrode located on the first gate insulation film, a second gate insulation film located on the floating gate electrode, a control gate electrode located on the second gate insulation film;
   memory cell array means which is constituted by arranging the memory cell means in an array such that the memory cell means can be accessed in response to address signals, said memory cell array means including a main memory cell matrix and a spare memory cell matrix, said spare memory cell matrix being operatable in response to the address signals in place of the main memory cell matrix;
   program element means, located outside the memory cell array means, for storing redundancy information corresponding to the address signals which permit the spare memory cell matrix to operate in place of the main memory cell matrix; and
   a MIS type transistor formed in the program element means to store the redundancy information, said MIS type transistor having a source region and a drain region which are located in a surface region of the semiconductor substrate, a third gate insulation film formed on that portion of the semiconductor substrate which is located between the source region and the drain region, a gate electrode located on the third gate insulation film, said third gate insulation film being a laminated film including a charge-carriers capturing film and an insulation film for covering at least peripheral portions of the charge-carriers capturing film.

2. A device according to claim 1, wherein said charge-carriers capturing film is a nitride film, and said laminated film includes a first oxide film, said nitride film, and a second oxide film which are stacked on the semiconductor substrate in the order mentioned.

3. A device according to claim 1, wherein said charge-carriers capturing film is a tantalum oxide film, and said laminated film includes a first oxide film, said tantalum oxide film, and a second oxide film which are stacked on the semiconductor substrate in the order mentioned.

4. A device according to claim 1, wherein said charge-carriers capturing film is an aluminum oxide film, and said laminated film includes a first oxide film, said aluminum oxide film, and a second oxide film which are stacked on the semiconductor substrate in the order mentioned.

5. A device according to any one of claims 2–4, wherein said first oxide film has a thickness of 50 angstroms or more.

6. A device according to any one of claims 2–4, wherein said second oxide film has a thickness of 25 angstroms or more.

7. A device according to claim 1, wherein said third gate insulation film is a laminated film having a substantially similar structure to that of the second gate insulation film.

8. An electrically erasable nonvolatile memory device comprising:
a semiconductor substrate;
memory cell means having a source region and a drain region which are located in a surface region of the semiconductor substrate, a first gate insulation film formed on that portion of the semiconductor substrate which is located between the source region and the drain region, a charge-accumulating floating gate electrode located on the first gate insulation film, a second gate insulation film located on the floating gate electrode, a control gate electrode located on the second gate insulation film;
memory cell array means which is constituted by arranging the memory cell means in an array such that the memory cell means can be accessed in response to address signals, said memory cell array means including a main memory cell matrix and a spare memory cell matrix, said spare memory cell matrix being operatable in response to the address signals in place of the main memory cell matrix;
program element means, located outside the memory cell array means, for storing redundancy information corresponding to the address signals which permit the spare memory cell matrix to operate in place of the main memory cell matrix; and
a MIS type transistor formed in the program element means to store the redundancy information, said MIS type transistor having a source region and a drain region which are located in a surface region of the semiconductor substrate, a third gate insulation film formed on that portion of the semiconductor substrate which is located between the source region and the drain region, a gate electrode located on the third gate insulation film, said third gate insulation film being a laminated film including a first oxide film, a nitride film, a second oxide film which are stacked on the semiconductor substrate in the order mentioned.

9. A device according to claim 8, wherein said third gate insulation film is a laminated film having a substantially similar structure to that of the second gate insulation film.

10. A device according to claim 9, wherein said first oxide film has a thickness of 50 angstroms or more, while said second oxide film has a thickness of 25 angstroms or more.

11. An electrically erasable nonvolatile memory device comprising:
a semiconductor substrate;
memory cell means having a source region and a drain region which are located in a surface region of the semiconductor substrate, a first gate insulation film formed on that portion of the semiconductor substrate which is located between the source region and the drain region, a charge-accumulating floating gate electrode located on the first gate insulation film, a second gate insulation film located on the floating gate electrode, a control gate electrode located on the second gate insulation film, said second gate insulation film being a laminated film including a first oxide film, a nitride film, a second oxide film which are stacked on the semiconductor substrate in the order mentioned;
memory cell array means which is constituted by arranging the memory cell means in an array such that the memory cell means can be accessed in response to address signals, said memory cell array means including a main memory cell matrix and a spare memory cell matrix, said spare memory cell matrix being operatable in response to the address signals in place of the main memory cell matrix;
program element means, located outside the memory cell array means, for storing redundancy information corresponding to the address signals which permit the spare memory cell matrix to operate in place of the main memory cell matrix; and
a MIS type transistor formed in the program element means to store the redundancy information, said MIS type transistor having a source region and a drain region which are located in a surface region of the semiconductor substrate, a third gate insulation film formed on that portion of the semiconductor substrate which is located between the source region and the drain region, a gate electrode located on the third gate insulation film, said third gate insulation film being a laminated film having a substantially similar structure to that of the second gate insulation film.

* * * * *